US011973317B2

(12) United States Patent
Marfeld et al.

(10) Patent No.: US 11,973,317 B2
(45) Date of Patent: Apr. 30, 2024

(54) SEMICONDUCTOR LASER AND PROJECTOR

(71) Applicant: OSRAM OLED GmbH, Regensburg (DE)

(72) Inventors: Jan Marfeld, Regensburg (DE); André Somers, Obertraubling (DE); Andreas Löffler, Neutraubling (DE); Sven Gerhard, Alteglofsheim (DE)

(73) Assignee: OSRAM OLED GMBH, Regensburg (DE)

( * ) Notice: Subject to any disclaimer, the term of this patent is extended or adjusted under 35 U.S.C. 154(b) by 879 days.

(21) Appl. No.: 16/982,425

(22) PCT Filed: Mar. 13, 2019

(86) PCT No.: PCT/EP2019/056324
§ 371 (c)(1),
(2) Date: Sep. 18, 2020

(87) PCT Pub. No.: WO2019/179852
PCT Pub. Date: Sep. 26, 2019

(65) Prior Publication Data
US 2021/0057884 A1    Feb. 25, 2021

(30) Foreign Application Priority Data
Mar. 21, 2018 (DE) .......................... 102018106685.6

(51) Int. Cl.
*H01S 5/0234* (2021.01)
*H01S 5/0237* (2021.01)
(Continued)

(52) U.S. Cl.
CPC .............. *H01S 5/22* (2013.01); *H01S 5/0234* (2021.01); *H01S 5/0237* (2021.01);
(Continued)

(58) Field of Classification Search
CPC .......... H01S 5/22–2277; H01S 5/0425–04256; H01S 5/40; H01S 5/4031; H01S 5/022;
(Continued)

(56) References Cited

U.S. PATENT DOCUMENTS

| 5,077,878 A | 1/1992 | Armiento et al. |
| 6,365,429 B1 | 4/2002 | Kneissl et al. |

(Continued)

FOREIGN PATENT DOCUMENTS

| CN | 1248350 | * 3/2000 | .......... G02B 6/4236 |
| DE | 102005007601 A1 | 9/2005 | |

(Continued)

*Primary Examiner* — Tom T Van Roy
*Assistant Examiner* — Delma R Fordé
(74) *Attorney, Agent, or Firm* — MH2 TECHNOLOGY LAW GROUP LLP

(57) ABSTRACT

In an embodiment, the semiconductor laser (1) comprises a semiconductor layer sequence (2) in which an active zone (22) for generating laser radiation (L) is located. Several electrical contact surfaces (5) serve for external electrical contacting of the semiconductor layer sequence (2). Several parallel ridge waveguides (3) are formed from the semiconductor layer sequence (2) and configured to guide the laser radiation (L) along a resonator axis, so that there is a separating trench (6) between adjacent ridge waveguides. At least one electrical feed (4) serves from at least one of the electrical contact surfaces (5) to guide the current to at least one of the ridge waveguides (3). A distance (A4) between the ridge waveguides is at most 50 μm. The ridge waveguides (3) are electrically controllable individually or in groups independently of one another and/or configured for single-mode operation.

18 Claims, 7 Drawing Sheets

Figure 3:
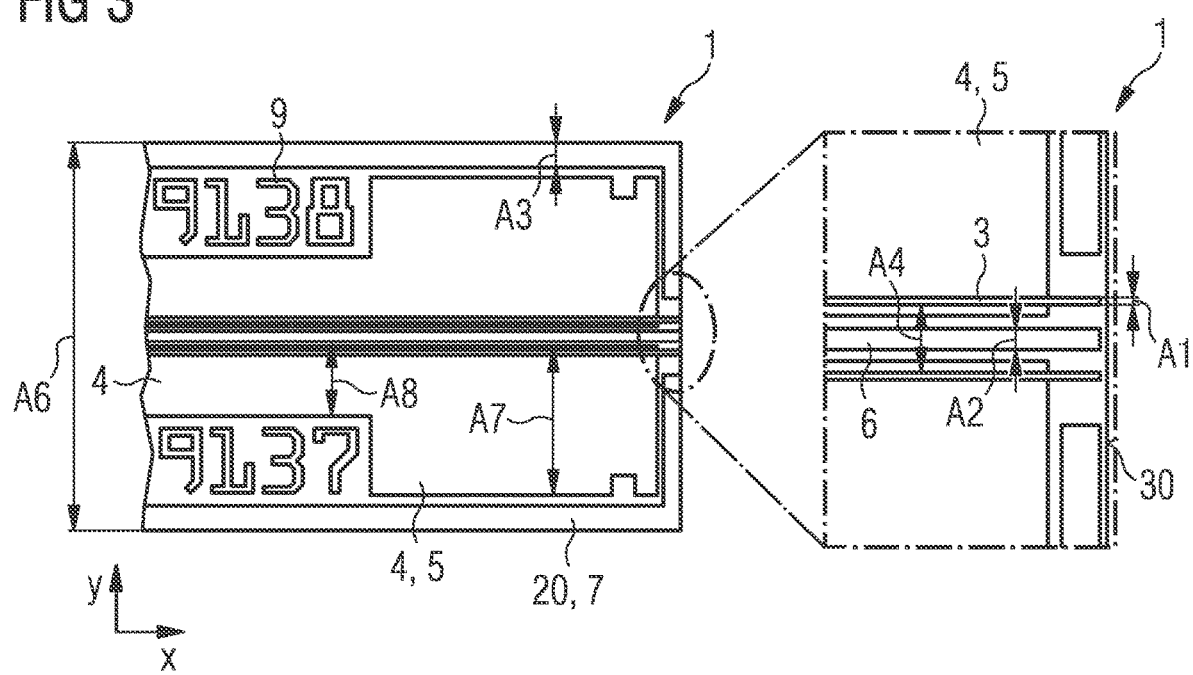

(51) Int. Cl.
  *H01S 5/02375* (2021.01)
  *H01S 5/024* (2006.01)
  *H01S 5/026* (2006.01)
  *H01S 5/042* (2006.01)
  *H01S 5/22* (2006.01)
  *H01S 5/323* (2006.01)
(52) U.S. Cl.
  CPC ...... *H01S 5/02375* (2021.01); *H01S 5/02469* (2013.01); *H01S 5/026* (2013.01); *H01S 5/0422* (2013.01); *H01S 5/32341* (2013.01)
(58) Field of Classification Search
  CPC .... H01S 5/0234; H01S 5/02345; H01S 5/023; H01S 5/02315; H01S 5/0233; H01S 5/0237; H01S 5/02375; H01S 5/4087; G03B 21/14
  See application file for complete search history.

(56) References Cited

U.S. PATENT DOCUMENTS

| | | |
|---|---|---|
| 10,886,704 B2 | 1/2021 | Singer et al. |
| 2004/0206975 A1 | 10/2004 | Tojo et al. |
| 2008/0063021 A1 | 3/2008 | Seo |
| 2012/0213241 A1 | 8/2012 | Lell et al. |
| 2012/0314398 A1 | 12/2012 | Raring et al. |

FOREIGN PATENT DOCUMENTS

| | | |
|---|---|---|
| DE | 102006044782 A1 | 4/2007 |
| DE | 102009039891 A1 | 3/2011 |
| DE | 102015116970 A1 | 4/2017 |
| JP | 2012204364 A | 10/2012 |
| WO | 2011069769 A2 | 6/2011 |
| WO | 2017144613 A1 | 8/2017 |

* cited by examiner

FIG 1
A)
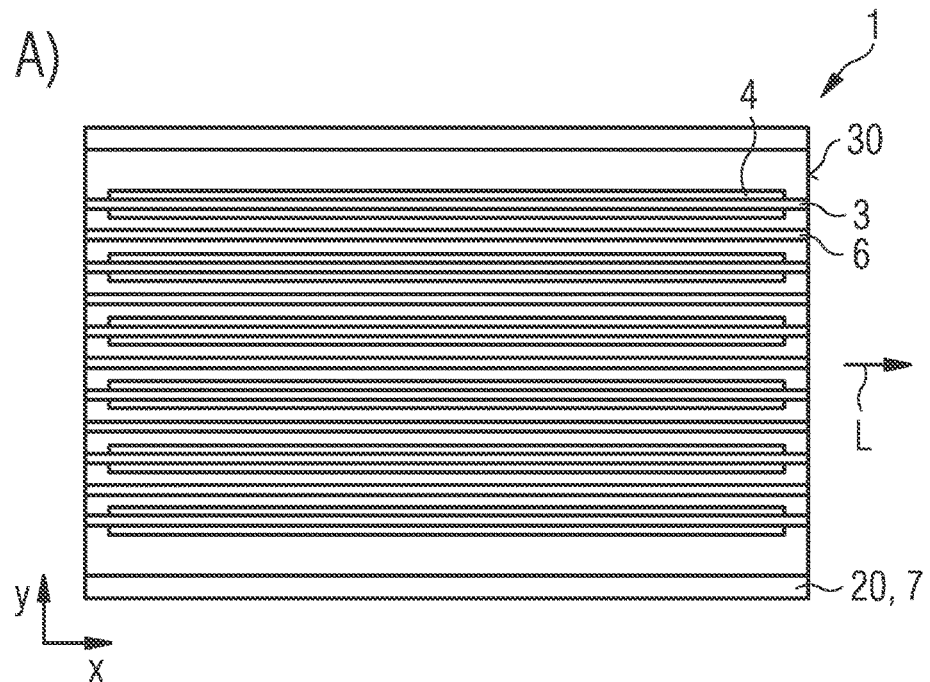
B)
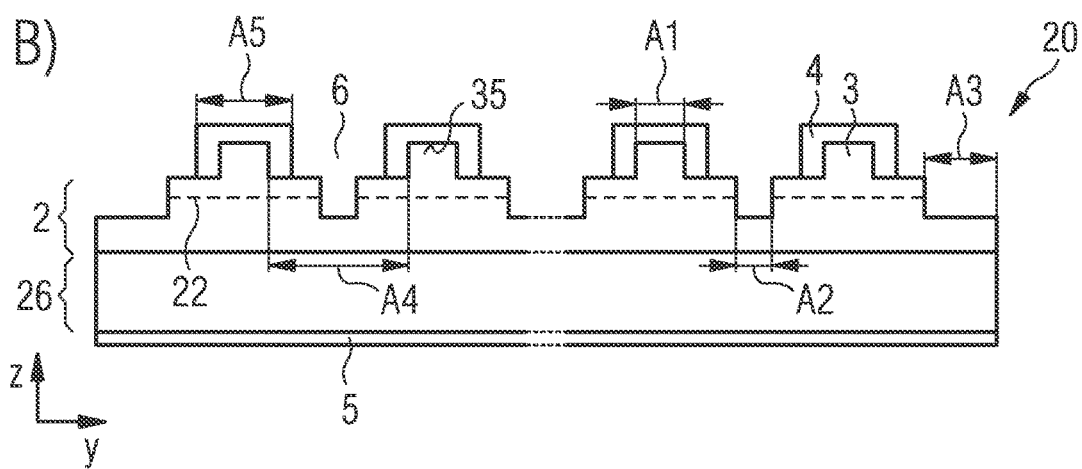
C)
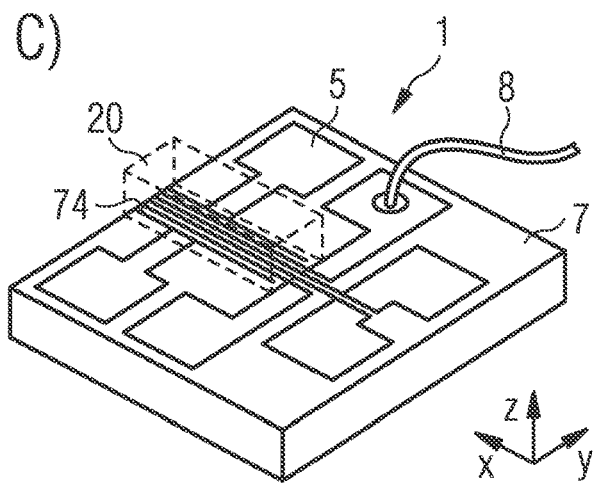

FIG 2
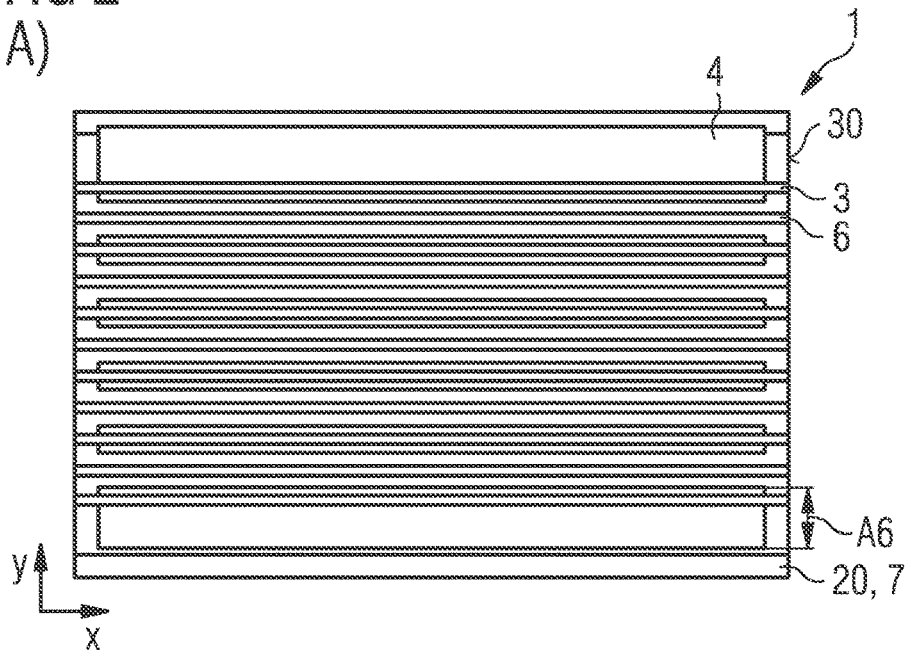
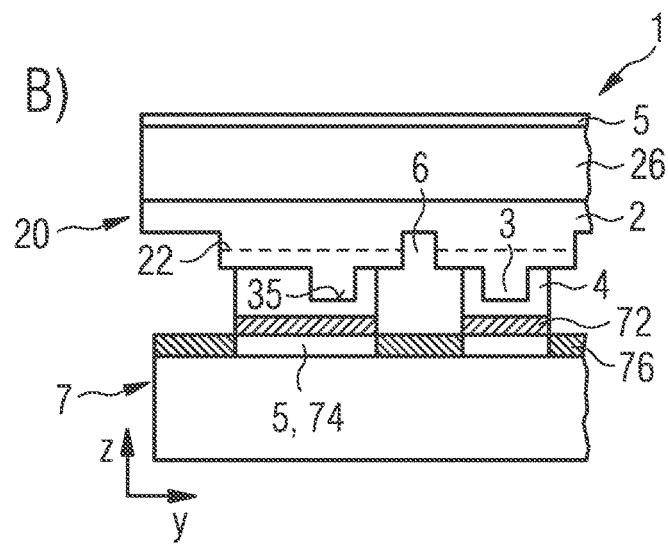
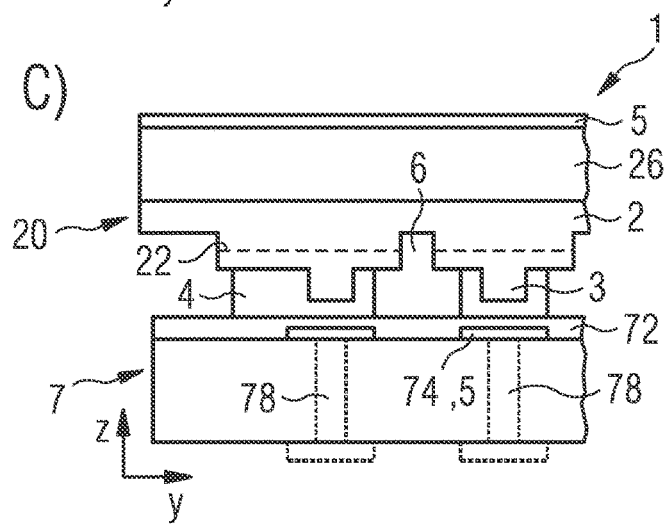

FIG 4
A)
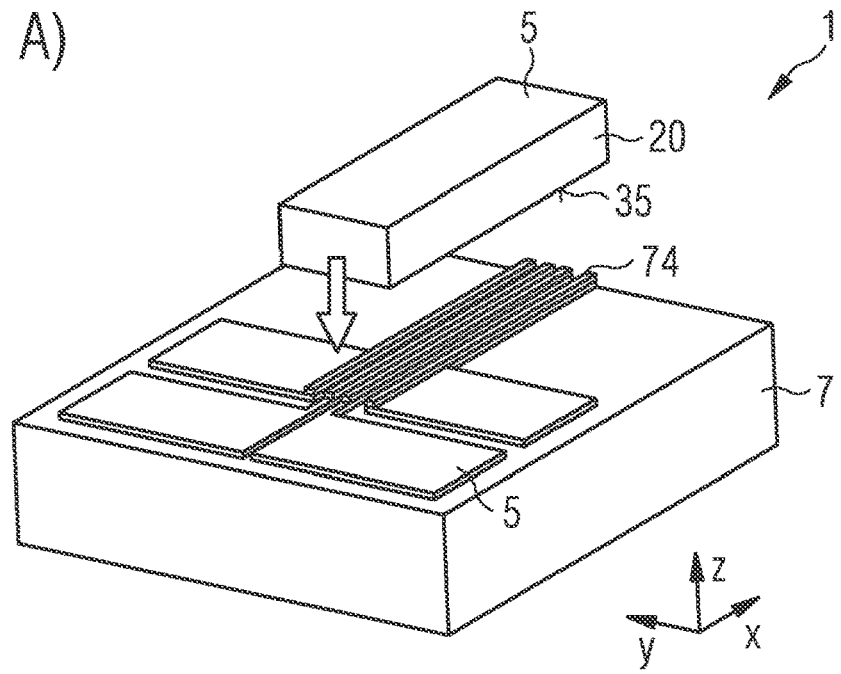
B)
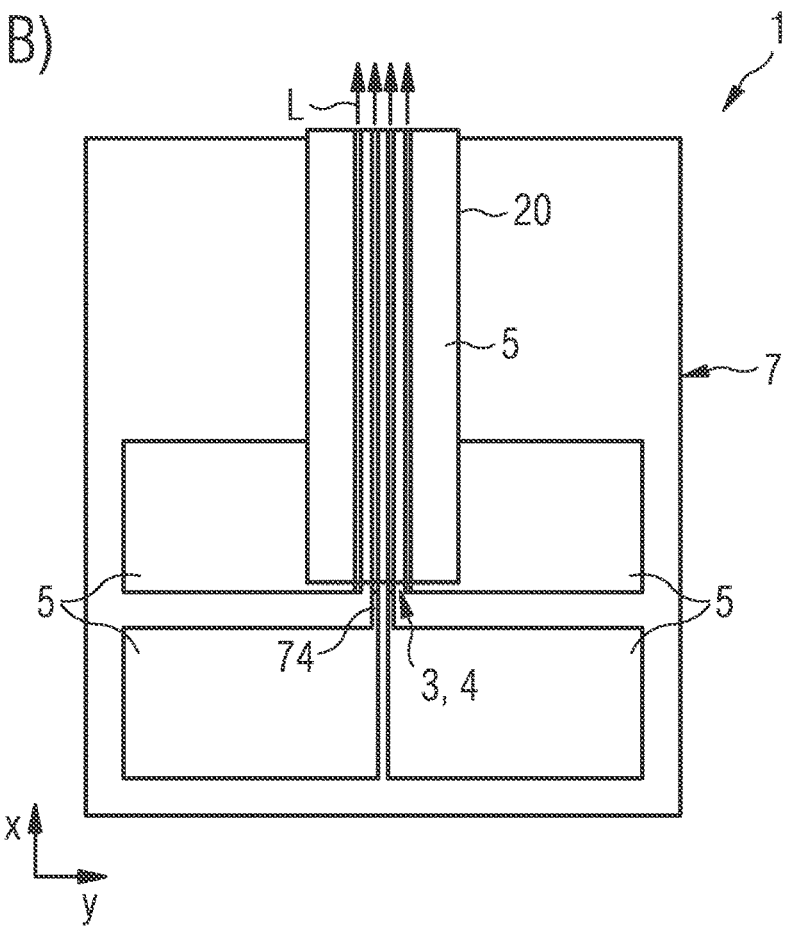

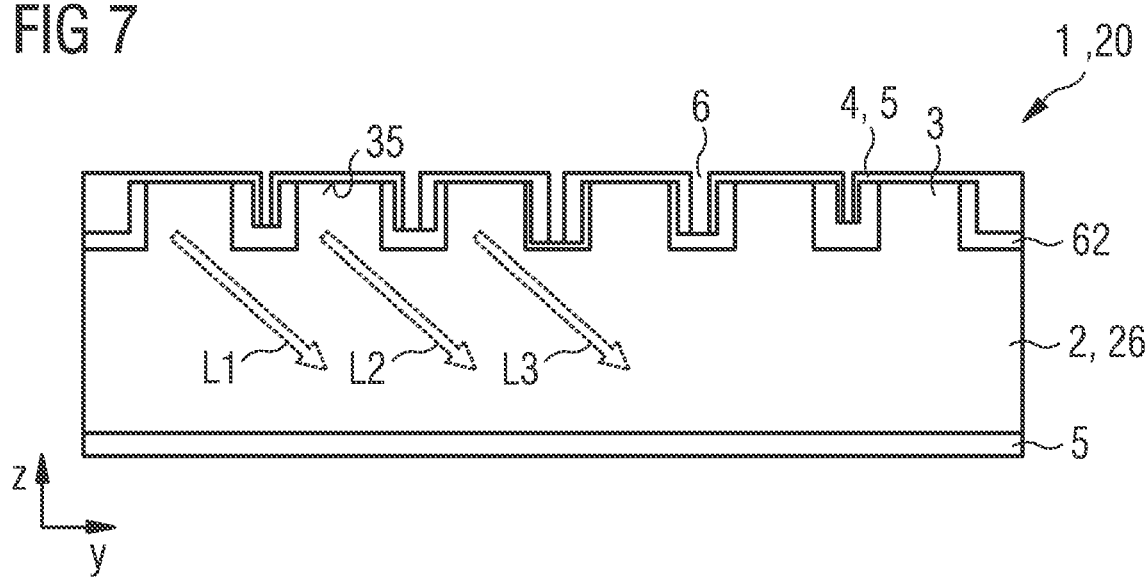
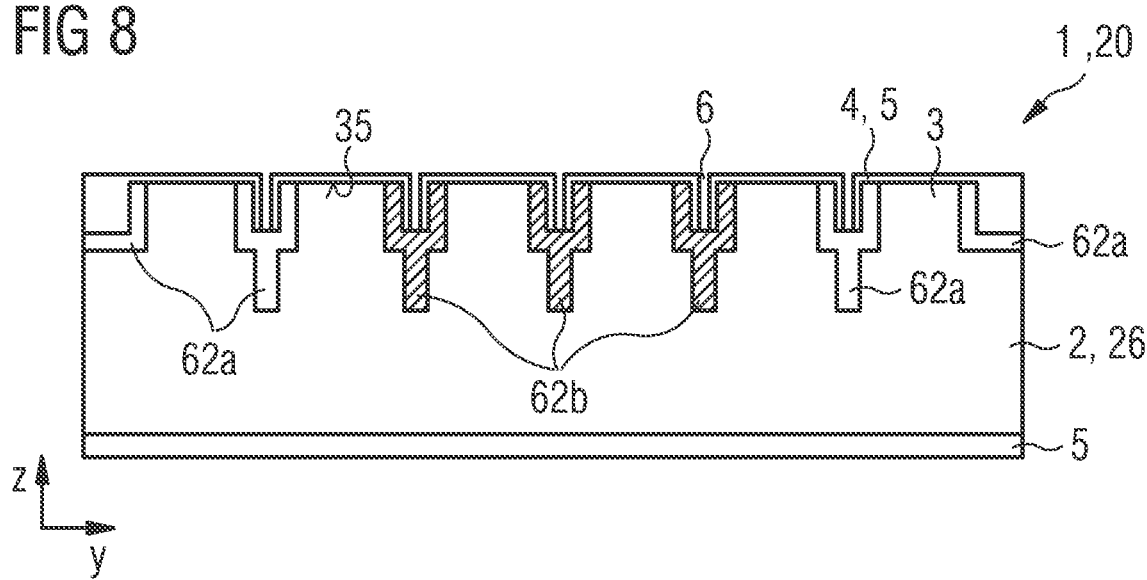

US 11,973,317 B2

SEMICONDUCTOR LASER AND PROJECTOR

CROSS-REFERENCE TO RELATED APPLICATIONS

This patent application is a national stage entry from International Application No. PCT/EP2019/056324, filed on Mar. 13, 2019, published as International Publication No. WO 2019/179852 A1 on Sep. 26, 2019, and claims priority under 35 U.S.C. § 119 from German patent application 10 2018 106 685.6, filed Mar. 21, 2018, the entire contents of all of which are incorporated by reference herein.

A semiconductor laser is specified. A projector is also specified.

US 2012/0213241 A1 refers to a semiconductor laser with several ridge waveguides, where the waveguides have a small distance to each other.

An object to be solved is to specify a semiconductor laser whose laser radiation can be efficiently imaged.

This object is solved, among other things, by a semiconductor laser with the features of claim 1. Preferred further developments are the subject of the other claims.

According to at least one embodiment, the semiconductor laser comprises a semiconductor layer sequence. The semiconductor layer sequence comprises an active zone for the generation of laser radiation. The active zone preferably contains a multiple quantum well structure, in short MQW, a single quantum well structure or a pn junction.

The semiconductor layer sequence is preferably based on a III-V compound semiconductor material. The semiconductor material is for example a nitride compound semiconductor material like $Al_nIn_{1-n-m}Ga_mN$ or a phosphide compound semiconductor material like $Al_nIn_{1-n-m}Ga_mP$ or also an arsenide compound semiconductor material such as $Al_nIn_{1-n-m}Ga_mAs$ or such as $Al_{n-}Ga_mIn_{1-n-m}As_kP_{1-k}$, where $0 \leq n \leq 1$, $0 \leq m \leq 1$ and $n+m \leq 1$ and $0 \leq k < 1$ hold, respectively. Preferably for at least one layer or for all layers of the semiconductor layer sequence $0 < n \leq 0.8$, $0.4 \leq m < 1$ and $n+m \leq 0.95$ as well as $0 < k \leq 0.5$ holds. The semiconductor layer sequence may contain dopants as well as additional constituents. For the sake of simplicity, however, only the essential constituents of the crystal lattice of the semiconductor layer sequence, i.e. Al, As, Ga, In, N or P, are given, even if these may be partially replaced and/or supplemented by small amounts of other substances.

According to at least one embodiment, the semiconductor laser comprises two or more than two electrical contact surfaces. The electrical contact surfaces are configured for external electrical contacting of the semiconductor layer sequence and/or the semiconductor laser. Preferably, the contact surfaces are each formed by one or more metal layers. The contact surfaces can thus be metallic components of the semiconductor laser.

According to at least one embodiment, the semiconductor laser comprises several ridge waveguides. The ridge waveguides are preferably arranged parallel to one another. Furthermore, the ridge waveguides are preferably formed from the semiconductor layer sequence, for example by etching. It is possible that the ridge waveguides are located on a p-type side of the semiconductor layer sequence and are etched out of a p-type layer. Alternatively, the ridge waveguides are formed from n-type semiconductor material.

The ridge waveguides are configured to guide the laser radiation along a resonator axis. The resonator axis preferably runs along a straight line, seen in top view. In the direction parallel to a growth direction of the semiconductor layer sequence, wave guiding is achieved by means of a waveguide which contains the active zone and is arranged between two cladding layers with a lower refractive index. Thus the ridge waveguides together with the cladding layers serve to guide the laser radiation.

According to at least one embodiment there is at least one separation trench between adjacent ridge waveguides. The separation trench is configured to electrically and/or optically isolate adjacent ridge waveguides from each other. The separation trench can reach up to the active zone and divide the active zone in places. Alternatively, it is possible that the separation trench does not extend as far as the active zone and is restricted, for example, to a p-type side of the semiconductor layer sequence. Furthermore, it is possible that separation trenches of different depths exist, with some separation trenches being able to penetrate the active zone and other, less deep separation trenches remaining at a distance from the active zone.

According to at least one embodiment, the semiconductor laser comprises at least one electrical feed. The electrical feed extends from at least one of the electrical contact surfaces to at least one of the ridge waveguides. It is possible that the electrical contact surface as well as the associated electrical feed are formed in one piece. For example, the feed and the associated contact surface are formed by the same metallization or metallizations. Preferably, however, the contact surfaces and the associated feeds are separate components.

According to at least one embodiment, a distance between at least two adjacent ridge waveguides or between the ridge waveguides in pairs is at most 50 µm or 40 µm or 20 µm or 5 µm. Alternatively or additionally this distance is at least 1 µm or 2 µm. This means that the ridge waveguides are arranged closely side by side.

According to at least one embodiment, the ridge waveguides are electrically controllable individually or in several groups independently of each other. This means that the respective ridge waveguides or groups of ridge waveguides can generate the laser radiation independently of each other.

According to at least one embodiment, all ridge waveguides or part of the ridge waveguides are configured for single mode operation. It is possible that the ridge waveguides configured for single mode operation are electrically combined and in particular electrically connected in parallel. The ridge waveguides configured for single mode operation may have a contact surface and/or electrical feed which directly connects all the ridge waveguides concerned electrically and/or which extends continuously over all the associated ridge waveguides.

In at least one embodiment, the semiconductor laser comprises a semiconductor layer sequence in which an active zone for generating laser radiation is located. At least two electrical contact surfaces serve for external electrical contacting of the semiconductor layer sequence. Several parallel ridge waveguides are each formed from the semiconductor layer sequence and are each configured to guide the laser radiation along a resonator axis so that at least one separating trench is present between adjacent ridge waveguides. At least one electrical feed serves from at least one of the electrical contact surfaces to a current supply to at least one of the ridge waveguides. A distance between at least two adjacent ridge waveguides is at most 50 µm. The ridge waveguides are electrically controllable individually or in groups independently of each other and/or configured for single-mode operation.

Currently, attempts are being made to use lasers for applications such as virtual reality or augmented reality. For example, lasers are built into corresponding glasses for this purpose. However, such laser-based glasses usually have only a very small field of view. One reason for this is the limited modulation capability of a single laser chip, which allows only a limited resolution.

With the semiconductor laser described here, it is possible, especially in the visible spectral range, to realize preferably several individually controllable emission points with the laser radiation of a single semiconductor chip, resulting in two or more independent laser beams. Due to the small distance between the ridge waveguides, an efficient optical imaging and/or further processing of the generated laser radiation is possible. Thus two or more independent pixels can be realized, which leads to a doubling or multiplication of the image resolution.

Other ways to increase resolution is the use of monomode-driven nitride lasers or nitride LEDs. However, this usually means the use of several semiconductor chips, so that increased space is required and optical imaging is more difficult. An increase in resolution through a higher modulation speed of the components reaches its limits due to the emitted power and technical limitations of the modulation capability. Furthermore, the minimum size of conventional laser chips is limited by the relatively large contact surfaces used, which are particularly necessary for wire bonding processes. This means that only comparatively large laser chips can be realized with comparatively large distances between them in the case of several ridge waveguides, or the ridge waveguides can only be controlled electrically together.

With the semiconductor laser described here, several individually controllable light emitters, also known as ridges or stripes, are preferably realized in very close proximity to each other on a semiconductor chip. In this way, higher resolutions can be achieved when imaging the laser radiation. In addition, the output power of the corresponding semiconductor chip can be increased and a single imaging optic is sufficient to generate several pixels with the semiconductor chip.

For this purpose, the sizes of the contact surfaces for the ridge waveguides on the semiconductor chip itself are preferably reduced to a minimum. The semiconductor chip is preferably no longer contacted by means of wire bonding, but is mounted, for example, upside down on an appropriately structured substrate or carrier. Each ridge waveguide is preferably connected to the carrier electrically isolated from other ridge waveguides. A common electrical contact of the ridge waveguides can be formed by an upper side of the semiconductor chip.

This allows very small distances between the ridge waveguides by minimizing the size of the contact surfaces on the semiconductor chip. This allows semiconductor chips with small geometric dimensions and with a large number of ridge waveguides to be realized. Since each ridge waveguide has its own electrical contact, a separate electrical control of each individual ridge waveguide is possible. This arrangement of semiconductor chips mounted upside down on a carrier can be easily integrated into a package using standard wire bonding techniques. This approach is also scalable in terms of the number of ridge waveguides per semiconductor chip. Due to the dense arrangement of the ridge waveguides, several projection points or light spots can be imaged by the same optics, resulting in cost savings.

The carrier for the semiconductor chip is, for example, made of aluminum nitride or silicon carbide, which can be coated with Ti, Pt and/or Au for the contact surfaces and can be contacted mechanically and electrically, especially by means of an AuSn soldering process. A further electrical contact of this arrangement is preferably made by a gold wire bonding process.

According to at least one embodiment, the semiconductor layer sequence is located on a growth substrate or on a substitute substrate for a growth substrate. The semiconductor layer sequence together with the growth substrate or the replacement substrate preferably forms a semiconductor chip. The semiconductor chip is preferably mechanically self-supporting and can be handled and attached to a carrier, in particular by means of a placement method using tweezers or a vacuum device.

According to at least one embodiment, the semiconductor laser comprises a carrier, also known as a submount. The semiconductor layer sequence is attached to the carrier by means of a connecting means. The carrier is based on a different material system than the semiconductor layer sequence and is preferably different from a growth substrate of the semiconductor layer sequence. The at least one connection means is in particular an organic or metallic connection means such as a solder or such as an anisotropic conductive adhesive or an anisotropic conductive film, in short ACF.

According to at least one embodiment, at least two of the contact surfaces or all but one contact surface or all contact surfaces are located on the carrier. This means that the semiconductor laser can only be electrically contacted externally via the carrier.

According to at least one embodiment, the carrier comprises one or more electrical conductor tracks. The conductor tracks are preferably metallic tracks. The electrical contact surfaces on the carrier are electrically connected to the feeds on the semiconductor layer sequence and the ridge waveguides via the connecting means. This means that the connecting means can be attached to the conductor tracks and not to the contact surfaces. In particular, the contact surfaces for external electrical contact of the semiconductor laser are free of the connecting means with which the semiconductor layer sequence is attached to the carrier.

According to at least one embodiment, there is at least one or exactly one contact surface on the carrier for each of the ridge waveguides. In addition, there may be a common counter contact for all ridge waveguides. Preferably there is a 1-to-1 assignment between the ridge waveguides and the contact surfaces, optionally with the exception of a contact surface that is common to all ridge waveguides.

According to at least one embodiment there is a flow stop layer between the contact surfaces of the carrier and/or between contact surfaces on the semiconductor layer sequence. The flow stop layer is preferably an organic layer, for example of a solder resist. The flow stop layer is configured to prevent a direct electrical connection between adjacent contact surfaces of the carrier and/or on the semiconductor layer sequence during joining, especially during soldering. The flow stop layer surrounds the assigned contact surfaces as seen in top view preferably all around in a closed path and can directly adjoin the contact surfaces.

According to at least one embodiment, the semiconductor layer sequence covers one or more of the contact surfaces located on the carrier as seen in top view. This at least one contact surface is only partially covered by the semiconductor layer sequence, so that this contact surface is preferably accessible by wire bonding.

According to at least one embodiment, a further electrical contact surface common to all ridge waveguides is located on a side of the semiconductor layer sequence or of the growth substrate of the semiconductor layer sequence remote from the ridge waveguides. Thus it is possible that the ridge waveguides are individually electrically contacted via the contact surfaces on the carrier and that a common electrical contact, for example an n-contact, is realized via the contact surface on the semiconductor layer sequence or on the growth substrate.

According to at least one embodiment, the carrier has a mounting surface. The mounting surface is preferably opposite to a side with the contact surfaces. It is possible that no electrical contact is made to the contact surfaces of the carrier via the mounting surface. For example, the carrier can be attached mechanically and preferably not electrically to a housing or in a housing, for example by soldering or gluing.

According to at least one embodiment, all contact surfaces are located on that side of the semiconductor layer sequence on which the ridge waveguides are formed. For this purpose the semiconductor laser preferably has an electrical connection line through the semiconductor layer sequence or over an edge of the semiconductor layer sequence. Especially with such an arrangement, it is possible that the carrier or submount can be omitted. The contact surfaces located on the semiconductor layer sequence can be designed as wire bonding surfaces or as soldering surfaces, so that the semiconductor layer sequence is be directly electrically contactable. Especially in this case the electrical feeds can be part of the respective electrical contact surfaces. Such an arrangement is preferably used if only a few of the ridge waveguides are present, for example, a maximum of four or two ridge waveguides.

According to at least one embodiment, the semiconductor laser is a flip-chip. This means that all electrical contact surfaces point to one side. In this case the semiconductor laser can be surface-mounted. Thus the semiconductor laser is a surface-mountable component, SMD for short.

According to at least one embodiment, at least one of the contact surfaces is arranged asymmetrically to the associated ridge waveguide when viewed from above. This means that, seen in top view, the ridge waveguide is not located centrally under the contact surface or at the contact surface. If there are more than two ridge waveguides, this is preferably the case for the ridge waveguides at the edges.

According to at least one embodiment, the arrangement of all contact surfaces taken together shows at most one axis of mirror symmetry when viewed from above. It is possible that there is no mirror axis of symmetry for the arrangement of all contact surfaces taken together when viewed from above. This can be used, for example, to provide reverse polarity protection and/or mounting markings.

According to at least one embodiment, at least some of the ridge waveguides are configured to have different temperatures when the semiconductor laser is operated as intended. Due to the different temperatures, a wavelength of maximum intensity of the laser radiation generated in the ridge waveguides varies. The variation of the wavelength of maximum intensity is preferably at least 0.5 nm or 1 nm or 2 nm and/or at most 10 nm or 5 nm.

A temperature difference across the ridge waveguides is preferably at least 10 K or 30 K and/or at most 100 K or 70 K. It is possible that the ridge waveguides experience no or no significant temperature difference along the respective resonator axis, so that the temperature difference is essentially limited to the direction transverse to the ridge waveguides. Thus, a one-dimensional temperature gradient may exist.

According to at least one embodiment, at least some of the separation trenches are different in cross-sectional view. This can be the case with regard to a depth and/or a width of the separation trenches and/or a basic shape of the separation trenches seen in cross-section. In particular, the separation trenches may have different basic geometric shapes, such as rectangular shapes, convex or concave shapes or T-shapes.

According to at least one embodiment at least one of the separation trenches or some separation trenches or all separation trenches are partially or completely filled with a passivation layer and/or with a heat conducting material. The passivation layer is preferably made of an electrically insulating material such as a silicon oxide or aluminum oxide. The thermal conductive material preferably has a thermal conductivity of at least 50 W/m·K or 100 W/m·K and is, for example, made of a metal or an electrically insulating material such as diamond-like carbon or a ceramic.

According to at least one embodiment, the passivation layer has a thickness gradient. This is especially true in the direction transverse to the ridge waveguides and seen in cross-section. Thus, it is possible that in areas with a greater thickness of the passivation layer, the associated ridge waveguides are thermally more strongly insulated. The ridge waveguides with a thicker passivation layer thus become warmer during intended operation of the semiconductor laser. This allows the temperature gradient across the ridge waveguides and thus their emission wavelength to be adjusted.

According to at least one embodiment, the heat conducting material only partially fills the separation trenches. Here, the heat conducting material can be electrically insulating and can touch the semiconductor layer sequence. Alternatively, the heat conducting material is electrically conductive and in this case is preferably applied to the passivation layer and not in direct contact with the semiconductor layer sequence.

According to at least one embodiment, the heat conducting material is distributed unevenly across the separation trenches. In particular, only some of the separation trenches are provided with the heat conducting material. This allows the ridge waveguides to be cooled to different degrees. Ridge waveguides with little or no heat conducting material are preferably warmer when the semiconductor laser is operated as intended.

According to at least one embodiment, the heat conducting material is electrically conductive and touches at least one of the feeds. It is possible that some of the feeds of adjacent ridge waveguides are electrically connected to each other by means of the heat conducting material. Alternatively, the thermally conductive material is electrically without function and is electrically connected to at most one of the feeds or the contact surfaces or none of the feeds and none of the contact surfaces.

According to at least one embodiment, at least some of the separation trenches are T-shaped when viewed in cross-section. It is possible that a width of the separation trenches decreases monotonically or strictly monotonically in the direction away from upper sides of the ridge waveguides. This means that the T-shaped separation trenches can have one or more steps. A lower part of the T's preferentially penetrates the active zone.

According to at least one embodiment, the semiconductor laser comprises at least six or eight or 16 of the ridge waveguides. Alternatively or additionally, the number of ridge waveguides is at most 128 or 64 or 32.

According to at least one embodiment, the semiconductor layer sequence is based on the AlInGaN material system. In this case the laser radiation preferably has a wavelength of maximum intensity of at least 385 nm or 405 nm or 440 nm. Alternatively or additionally the wavelength of maximum intensity is at most 540 nm or 530 nm or 485 nm.

A projector is also specified. The projector includes at least one semiconductor laser as specified in connection with one or more of the above embodiments. Features of the projector are therefore also disclosed for the semiconductor laser and vice versa.

In at least one embodiment, the projector comprises one or more semiconductor lasers and one or more lenses. The at least one lens is configured to project the laser radiation generated during operation. Between the semiconductor lasers and the lenses, if several semiconductor lasers and lenses are present, there is preferably a one-to-one correspondence. The lens in question is arranged optically downstream of all ridge waveguides of the associated semiconductor laser. Several semiconductor lasers can also be assigned to a single lens.

In the following, a semiconductor laser described here and a projector described here are explained in more detail with reference to the drawing using exemplary embodiments. Same reference signs indicate same elements in the individual figures. However, no scale references are shown; individual elements may be shown in exaggerated size for better understanding.

Figure 5:
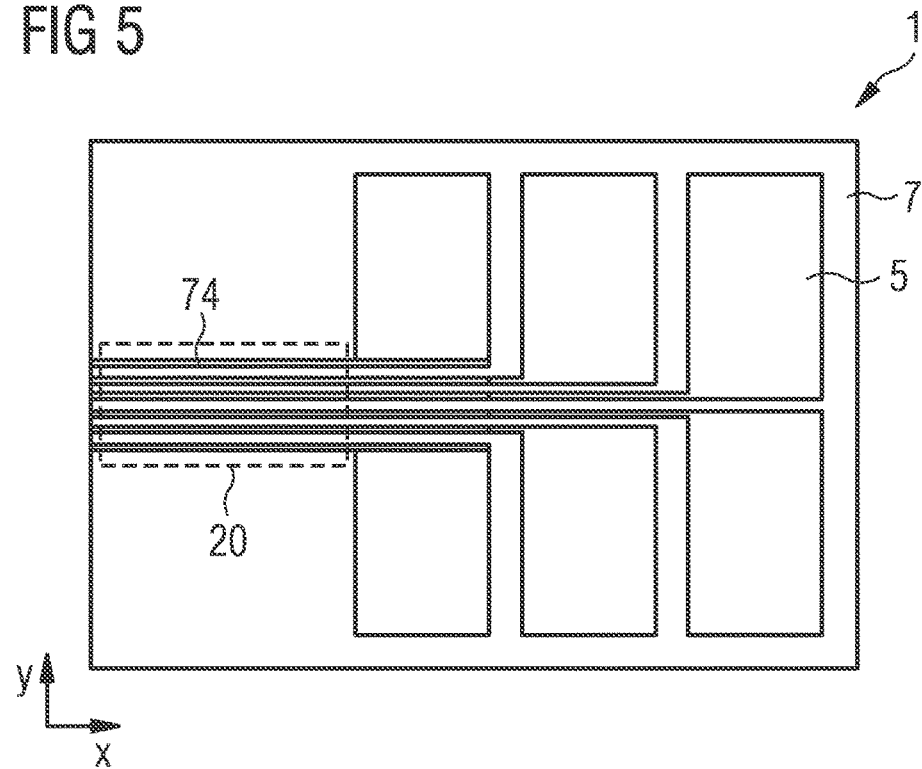
Figure 9:
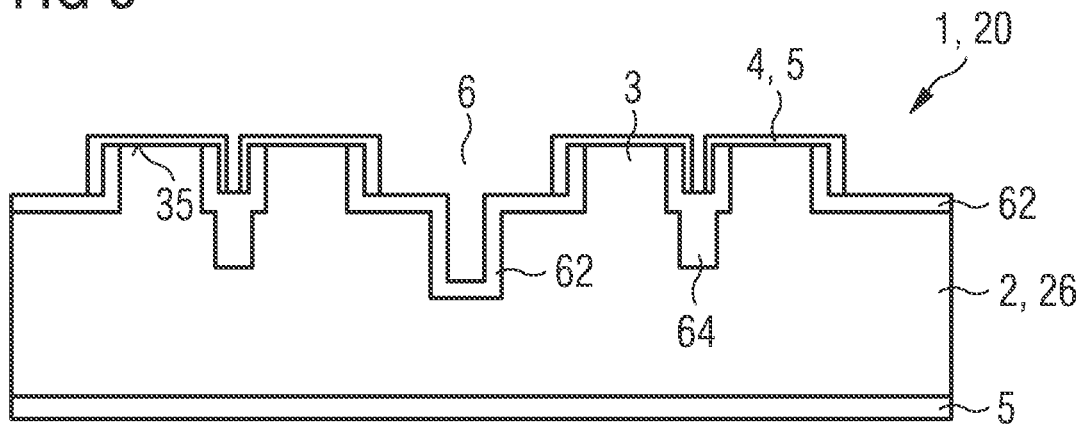
Figure 10:
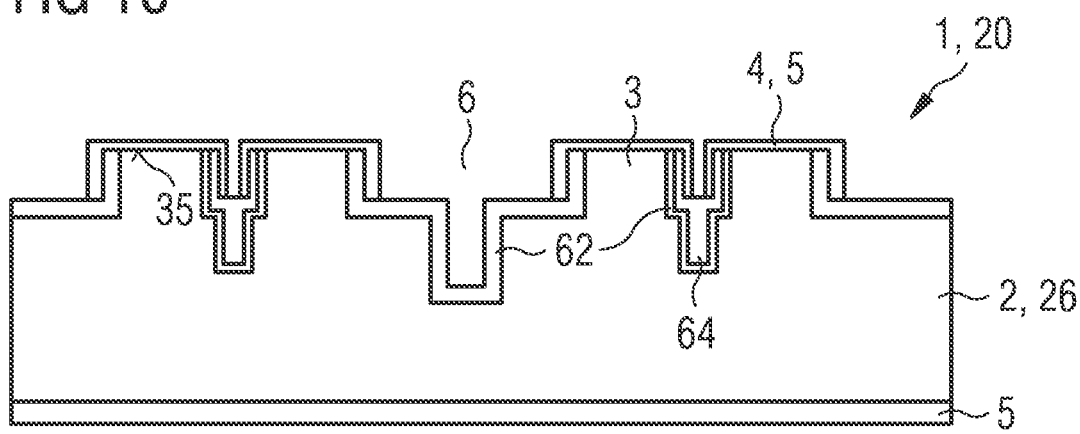
Figure 11:
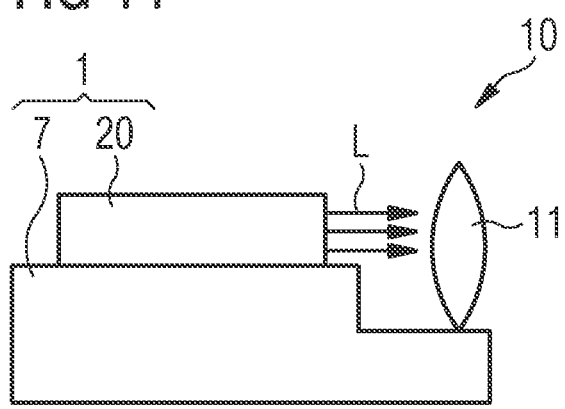

In the Figures:

FIGS. 1A, 2A and 3 show schematic top views of exemplary embodiments of semiconductor lasers described here, FIGS. 1B, 2B and 2C show schematic sectional views of exemplary embodiments of semiconductor lasers described here, FIGS. 1C and 4A show schematic perspective views of exemplary embodiments of semiconductor lasers described here, FIGS. 4B and 5 show schematic top views of exemplary embodiments of semiconductor lasers described here, FIGS. 6A and 6B show schematic sectional views of exemplary embodiments of semiconductor lasers described here, FIGS. 7 to 10 show schematic sectional views of exemplary embodiments of semiconductor lasers described here, and FIG. 11 shows a schematic sectional view of an exemplary embodiment of a projector described here with a semiconductor laser described here.

FIG. 1 illustrates an exemplary embodiment of a semiconductor laser 1. The semiconductor laser 1 has a semiconductor layer sequence 2. In the semiconductor layer sequence 2 there is an active zone 22 for generating laser radiation L. Optionally, the semiconductor layer sequence 2 is located on a growth substrate 26.

From the semiconductor layer sequence 2, several ridge waveguides 3 are formed by etching, for instance, wherein the ridge waveguides 3 are arranged parallel to one another. Seen in top view, the ridge waveguides 3 can all be designed the same within the manufacturing tolerances. Preferably, the ridge waveguides 3 do not reach the active zone 22. The ridge waveguides 3 can be so narrow that the semiconductor laser 1 is operated in single mode.

There are separation trenches 6 between adjacent ridge waveguides 3. Seen in cross section, the separation trenches 6 are T-shaped. An upper part of the separation trenches 6 is connected to the ridge waveguides 3 in a lateral direction, parallel to the active zone 22. A lower part of the separation trenches 6 can reach through the active zone 22.

Furthermore, electrical feeds 4 are located directly at the ridge waveguides 3, and the ridge waveguides 3 are supplied with current via the feeds 4. On a side of the growth substrate 26 facing away from the ridge waveguides 3 there can be a common electrical contact surface 5 for all ridge waveguides 3. The electrical feeds 4 are each uniquely assigned to the ridge waveguides 3.

It is possible that the electrical feeds 4 do not reach facets 30 of the semiconductor layer sequence 2. This prevents optical damage, COD for short or Catastrophic Optical Damage, to the facets 30, since no current is applied directly to the facets 30 or only a reduced current is applied to the active zone 22.

The semiconductor layer sequence 2 is preferably mechanically self-supporting together with the growth substrate 26 and can be handled with tweezers. Thus the semiconductor layer sequence 2 forms a semiconductor chip 20 with the growth substrate 26, the electrical feeds 4 and the electrical contact surface 5 on the growth substrate 26.

Furthermore, the semiconductor laser 1 comprises a carrier 7. The semiconductor chip 20 is mounted on electrical conductor tracks 74 of the carrier 7. There is a one-to-one assignment between the conductor tracks 74 and the electrical feeds 4. The feeds 4 and the assigned conductor tracks 74 can run congruently within the manufacturing tolerances, especially along a transverse direction y. It is possible that the feeds 4, seen in cross-section, especially in the yz plane, surround the associated ridge waveguides 3 in a U-shape. A thickness of the feeds 4 on side faces of the ridge waveguides 3 can be greater than on upper sides 35 of the ridge waveguides 3.

The ridge waveguides 3 are arranged close together. Thus a distance A4 between adjacent ridge waveguides 3 is preferably at least 2 μm or 10 μm and/or at most 50 μm, in particular between 20 μm and 40 μm inclusive. A width A1 of the ridge waveguides 3 in the y-direction is preferably between 1.0 μm and 2.5 μm inclusive, in particular between 1.5 μm and 2.1 μm inclusive. A minimum width A2 of the separation trenches 6 in the active region of zone 22 is in particular between 2 μm and 50 μm, preferably between 2 μm and 15 μm. A mesa width A3 at one edge of the semiconductor chip 20 is preferably between 20 μm and 80 μm inclusive, in particular between 25 μm and 55 μm inclusive. A width A5 of the feeds 4 at the ridge waveguides 3 is preferably between 3 μm and 20 μm, in particular between 4 μm and 8 μm. Unless otherwise indicated, these values also apply to all other exemplary embodiments.

The contact surfaces 5 on the carrier 7 are configured as bonding surfaces. This means that the carrier 7 and thus the semiconductor laser 1 can be electrically contacted by means of bonding wires 8. An underside of the carrier 7 is preferably accessible by adhesive bonding or soldering. The carrier 7 can be configured as a heat sink and/or for heat dissipation and thus for cooling the semiconductor chip 20.

FIG. 2 illustrates another exemplary embodiment. Here, the external feeds 4 are designed asymmetrically with respect to the associated ridge waveguide 3. A width A6 of the outer feeds 4 is preferably between 10 μm and 80 μm, especially between 6 μm and 20 μm. The ridge waveguide 3 lies within the inner 10% to 45% of the width A6 with respect to the width A6, in particular within the inner 10% to 35% of the width A6.

FIGS. 2B and 2C further illustrate ways of mounting the semiconductor chip 2 on the carrier 7. The semiconductor chips 20 are mounted upside down on the carrier 7. Upside down means that the upper sides 35 of the ridge waveguides 3 each face the carrier 7.

As shown in FIG. 2B, a solder is used as the connecting means 72. On the carrier 7 there is preferably a flow stop layer 76 between the electrical contact surfaces 5 and/or the electrical tracks 74, for example made of a solder resist. This allows the connecting means 72 to be congruent with the tracks 74 and the feeds 4.

On the other hand, according to FIG. 2C, a continuous connecting means layer 72 is used, preferably made of an anisotropic conductive adhesive. Due to the anisotropic conductivity, electrical short circuits between adjacent tracks 74 are avoided. In addition, FIG. 2C illustrates that the contact surfaces 5 can be led through the carrier to the underside of the carrier 7 via vias 78, so that the semiconductor laser 1 can be surface-mounted as a whole. The vias 78 are drawn as dashed lines in FIG. 2C.

The electrical and mechanical connection between the semiconductor chips 20 and the carriers 7 described in FIGS. 2B and 2C can be present in all other exemplary embodiments accordingly. In contrast to the illustration, it is possible that the feeds 4 and the carriers 74 have different dimensions in the y-direction, for example to achieve mounting tolerances.

FIGS. 1B, 2B and 2C each show that the feeds 4 have a flat upper side facing away from the semiconductor layer sequence 2. This can be achieved, for example, by planarizing the feeds 4 or by anisotropically depositing a material for the feeds 4. Deviating from this it is possible in a preferred design that the feeds 4 have a constant thickness. Since the ridge waveguides 3 have only a small expansion in the z-direction, for example at least 0.2 µm or 0.5 µm and/or at most 10 µm or 2 µm, the difference in height then existing between the different areas of the electrical feeds 4 can be compensated for by varying the thickness of the connecting means 72. The same applies to all other exemplary embodiments.

In the exemplary embodiment shown in FIG. 3 there are only two ridge waveguides 3. FIG. 3, right half, shows a sectional enlargement from FIG. 3, left half.

The feeds 4 can also serve as contact surfaces 5 and are arranged asymmetrically to the respective ridge waveguides 3. In order to achieve a better connection of bonding wires at the contact surfaces 5, for example, these have a comparatively large width A7 close to the facets 30, which is preferably between 10 µm and 200 µm inclusive, and especially between 90 µm and 120 µm inclusive. Starting from these wide areas, narrower areas with a width A8 are given, which preferably serve as feeds 4 and not as contact surfaces. The width A8 is in particular between 10 µm and 60 µm, preferably between 45 µm and 55 µm. The asymmetry of the ridge waveguides 3 to the contact surfaces 5 is preferably pronounced in the same way as in FIG. 2. In the area with the reduced width A8 there may optionally be a marking 9, for example as a numbering or lettering.

An overall width A6 of the semiconductor chip 20 and/or the semiconductor laser 1 along the y-direction transverse to the ridge waveguides 3 is preferably at least 0.1 mm and/or at most 0.5 mm, in particular between 300 µm and 450 µm inclusive.

The explanations in FIG. 3 regarding the asymmetrical contact surfaces and feeds 4, 5 and the widths A6, A7, A8 apply accordingly to all other exemplary embodiments.

FIG. 4A illustrates a schematic diagram of how the semiconductor chip 20 is attached to the carrier 7. There are four symmetrically arranged contact surfaces 5 on the carrier 7 and a common contact surface 5 on the semiconductor chip 20.

FIG. 4B illustrates that two of the contact surfaces 5 on the carrier 7 are partially covered by the semiconductor chip 20.

FIG. 5 illustrates another design of carrier 7 and its contact surfaces 5, which can be used alternatively in conjunction with FIGS. 1 and 2. The contact surfaces 5 are each connected to one of the electrical contact surfaces 74 and have increasing widths in the y-direction away from the contact surfaces 74. In this way a comparatively symmetrical arrangement of the contact surfaces 5 on the carrier 7 can be achieved. The contact surfaces 5 can be free from the semiconductor chip 20.

Figure 6:
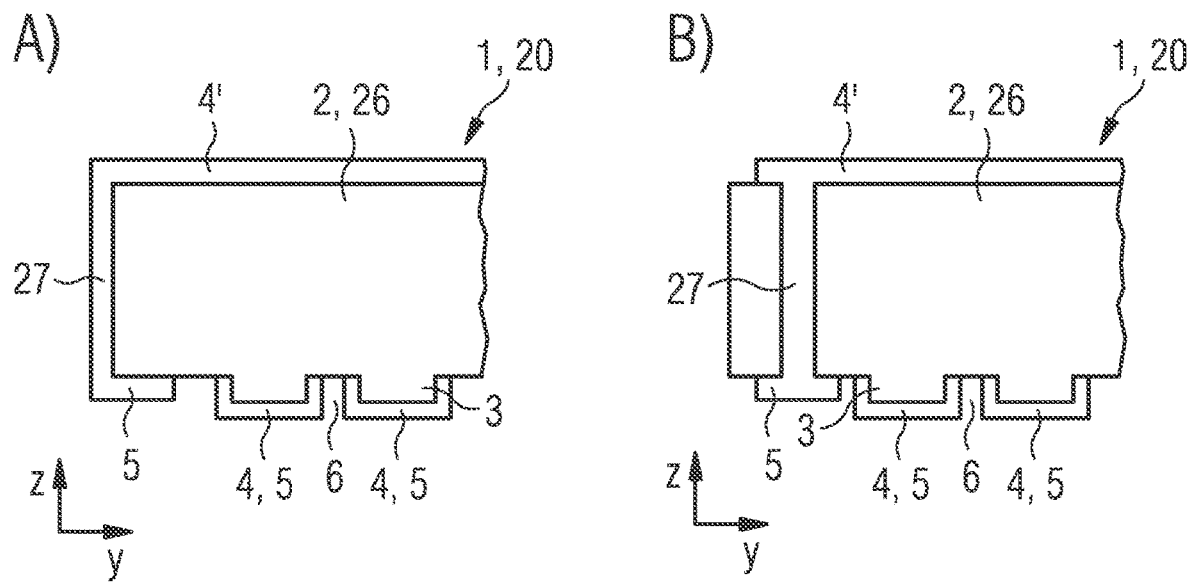

FIG. 6 illustrates that all contact surfaces 5 are drawn to the side of the semiconductor layer sequence 2 with the ridge waveguides 3. In this case it is possible that no separate carrier or submount is required. In such a design of the semiconductor chip 20, a surface-mountable carrier with the vias 78 is preferred, as explained in connection with FIG. 2C.

As shown in FIG. 6A, an electrical connection line 27 is routed over side surfaces of the semiconductor layer sequence 2 and the optional growth substrate 26, so that the feed 4' is attached to a back side. Departing therefrom, as shown in FIG. 6B, the electrical connection line 27 is a via through the semiconductor layer sequence 2 and the optional growth substrate 26.

To simplify the illustration, electrical insulation layers and passivation layers for the electrical separation of the electrical contact surfaces 5 and the feeds 4, 4' as well as the connection lines 27 are not specifically shown in FIG. 6.

In the exemplary embodiments of FIGS. 7 to 10, the ridge waveguides 3 are thermally insulated and thermally coupled in different ways. This makes it possible to generate 3 laser beams L1, L2, L3 with different wavelengths of maximum intensity due to the different temperatures at the ridge waveguides during operation.

According to FIG. 7, a passivation layer 62, for example of silicon dioxide, has a thickness gradient. For example, the passivation layer 62 is thinner in a central area of the semiconductor chip 20, seen in the y-direction, and becomes increasingly thicker towards one edge. In the same way, it is possible that the feeds 4, seen in the y-direction, become thicker towards the center and thinner towards an edge, at least on the side faces of the ridge waveguides 3.

FIG. 8 illustrates that the separation trenches 6 are partially T-shaped. The separation trenches 6 are each partially filled by a material of the passivation layers 62a, 62b. There is a first passivation layer 62a and a second passivation layer 62b, which differ in their thermal conductivities. In particular, silicon carbide, aluminum nitride or diamond-like carbon, DLC for short, is used as the second passivation layer 62b with a high thermal conductivity. As first passivation layer 62a with a lower thermal conductivity, for example silicon nitride, silicon dioxide or aluminum oxide is used.

In the exemplary embodiment shown in FIG. 9, the separation trenches 6 have different designs. Closer neighboring ridge waveguides 3 are thermally more strongly coupled to each other via a heat conducting material 64. Such ridge waveguides 3 can also be electrically combined into groups, but are preferably electrically controllable independently of each other. The heat conducting material 64 is for example aluminum nitride, silicon carbide or diamond-like carbon. If the heat-conducting material 64 is an electrically conductive material, the respective feeds 4 can be electrically connected to each other via the heat-conducting material 64.

FIG. 10 illustrates that, unlike in FIG. 9, the heat conducting material 64 is not in direct contact with the semiconductor layer sequence 2, but is applied to the passivation layer 62. The heat conducting material 64 is, for example, a metal such as gold, platinum, nickel, palladium, titanium or silver.

In contrast to the illustrations in FIGS. 9 and 10, the heat-conducting material 64 can also completely fill the associated separation trenches 6. By means of the passivation layers 62, 62a, 62b and the heat-conducting material 64 drawn in FIGS. 7 to 10, it is possible to achieve not only an electrical connection or insulation of adjacent ridge waveguides 3 but also optical insulation of the ridge waveguides 3 from each other.

FIG. 11 illustrates an exemplary embodiment of a projector 10 for example for glasses for virtual reality applications. In particular, a lens 11 is attached to the carrier 7. The lens 11 is used to optically image the laser radiation L of all ridge waveguides 3 of the associated semiconductor chip 20. This allows a simplified and efficient imaging of the laser radiation 11.

Unless otherwise indicated, the components shown in the figures preferably follow one another in the order given. Layers not touching each other in the figures are preferably spaced apart. If lines are drawn parallel to each other, the corresponding surfaces are preferably aligned parallel to each other. Likewise, unless otherwise indicated, the relative positions of the drawn components to each other are correctly shown in the figures.

The invention described here is not limited by the description using the exemplary embodiments. Rather, the invention comprises each new feature as well as each combination of features, which in particular includes each combination of features in the claims, even if this feature or combination itself is not explicitly stated in the claims or exemplary embodiments.

LIST OF REFERENCE SIGNS 1 semiconductor laser
2 semiconductor layer sequence
20 semiconductor chip
22 active zone
26 growth substrate
27 electrical connection line
3 ridge waveguide
30 facet
35 upper side of the ridge waveguide
4 electrical feed
5 electrical contact surface
6 separation trench
62 passivation layer
64 heat conducting material
7 carrier
72 connection means
74 electrical conductor track
76 flow stop layer
78 via
8 bonding wire
9 marking
10 projector
11 lens
A distance/width
L laser radiation

The invention claimed is:

1. A semiconductor laser comprising
a semiconductor layer sequence in which an active zone for generating a laser radiation is located,
several electrical contact surfaces for external electrical contacting of the semiconductor layer sequence,
a plurality of parallel ridge waveguides, each of which is formed from the semiconductor layer sequence and each of which is configured to guide the laser radiation along a resonator axis so that at least one separation trench is present between adjacent ridge waveguides, and
several electrical feeds from at least one of the electrical contact surfaces to at least one of the ridge waveguides, and
a carrier, to which the semiconductor layer sequence is applied by means of at least one connecting means, where
a distance between at least two adjacent ridge waveguides is at most 50 μm, and
the ridge waveguides are at least one of (i) electrically controllable individually or in groups independently of one another and (ii) are configured for single-mode operation,
the carrier comprises several electrical conductor tracks that electrically connect the contact surfaces at the carrier via the connecting means to the feeds, and
the semiconductor layer sequence is configured as semiconductor chip and all contact surfaces are located at the carrier, so that the semiconductor laser is surface-mountable.

2. The semiconductor laser according to claim 1,
further comprising a carrier on which the semiconductor layer sequence is attached by means of at least one organic or metallic connection means,
wherein the semiconductor layer sequence is designed as a semiconductor chip and at least two of the contact surfaces are located on the carrier.

3. The semiconductor laser according to claim 2,
in which the carrier comprises a plurality of electrical conductor tracks which electrically connect the contact surfaces on the carrier to the feeds via the connecting means,
wherein at least one contact surface is provided on the carrier for each of the ridge waveguides.

4. The semiconductor laser according to claim 2,
in which the connecting means is a solder or a continuously applied anisotropic electrically conductive adhesive.

5. The semiconductor laser according to claim 2,
in which the semiconductor layer sequence partially covers at least one of the contact surfaces located on the carrier,
wherein a further contact surface for all ridge waveguides in common is located on a side of the semiconductor layer sequence or of a growth substrate of the semiconductor layer sequence remote from the ridge waveguides.

6. The semiconductor laser according to claim 1,
in which there is a flow stop layer between the contact surfaces of the carrier,
wherein the flow stop layer is configured to prevent direct electrical connections between adjacent contact surfaces of the carrier.

7. The semiconductor laser according to claim 1,
in which all contact surfaces are located on that side of the semiconductor layer sequence on which the ridge waveguides are formed, wherein an electrical connection line extends through the semiconductor layer sequence or over an edge of the semiconductor layer sequence, and wherein the contact surfaces are configured as soldering surfaces and/or as wire bonding surfaces.

8. The semiconductor laser according to claim 1, which is a flip chip.

9. The semiconductor laser according to claim 1, in which at least one of the contact surfaces is arranged asymmetrically to the associated ridge waveguide when viewed in top view, whereby, seen in top view, an arrangement of all contact surfaces together shows at most one axis of mirror symmetry.

10. The semiconductor laser according to claim 1, in which at least some of the ridge waveguides have a temperature difference of at least 30 K from one another during the intended operation of the semiconductor laser.

11. The semiconductor laser according to claim 1, wherein the at least one separation trench is partially or completely filled with a passivation layer and/or with a heat conducting material.

12. The semiconductor laser according to claim 11, in which the passivation layer exhibits a thickness gradient so that in regions with a greater thickness of the passivation layer the associated ridge waveguides are thermally more strongly insulated.

13. The semiconductor laser according to claim 11, in which the heat conducting material only partially fills the separation trench, wherein the heat conducting material is electrically insulating and contacts the semiconductor layer sequence, and wherein the heat conducting material is unevenly distributed across the separation trench.

14. The semiconductor laser according to claim 11, in which the heat conducting material is electrically conductive and is applied to the passivation layer, wherein said heat conducting material contacts at least one of said feeds.

15. The semiconductor laser according to claim 1, in which of the separating trench is T-shaped when viewed in cross-section, and a width of the separating trench decreases monotonically or strictly monotonically in the direction away from upper sides of the ridge waveguides, so that the separating trench has at least one step.

16. The semiconductor laser according to claim 1, comprising at least eight and at most 64 of the ridge waveguides, wherein the semiconductor layer sequence is based on the material system AlInGaN and the laser radiation has a wavelength of maximum intensity between 385 nm and 540 nm inclusive.

17. A projector having at least one semiconductor laser according to claim 1 and having a lens for projecting the laser radiation generated during operation, wherein the lens is arranged jointly downstream of all ridge waveguides of the semiconductor laser concerned.

18. The semiconductor laser according to claim 1, further comprising a further separation trench between adjacent ridge waveguides, wherein the separation trench and the further separation trench are differently shaped from one another in cross-section.

* * * * *